US008716135B1

(12) United States Patent
Huckabay et al.

(10) Patent No.: US 8,716,135 B1
(45) Date of Patent: May 6, 2014

(54) METHOD OF ELIMINATING A LITHOGRAPHY OPERATION

(75) Inventors: Judy Huckabay, Fremont, CA (US); Milind Weling, Pleasanton, CA (US); Abdurrahman Sezginer, Monte Sereno, CA (US)

(73) Assignee: Cadence Design Systems, Inc., San Jose, CA (US)

(*) Notice: Subject to any disclaimer, the term of this patent is extended or adjusted under 35 U.S.C. 154(b) by 1245 days.

(21) Appl. No.: 12/264,139

(22) Filed: Nov. 3, 2008

Related U.S. Application Data

(60) Provisional application No. 61/024,870, filed on Jan. 30, 2008.

(51) Int. Cl.
*H01L 21/308* (2006.01)
*H01L 21/033* (2006.01)
*H01L 21/306* (2006.01)

(52) U.S. Cl.
CPC ...... *H01L 21/0338* (2013.01); *H01L 21/30621* (2013.01); *H01L 21/0334* (2013.01)
USPC ............ 438/696; 438/151; 438/618; 438/637

(58) Field of Classification Search
CPC .................. H01L 21/0338; H01L 21/30621; H01L 21/0334
USPC ........................ 438/151, 618, 637, 720, 696
See application file for complete search history.

(56) References Cited

U.S. PATENT DOCUMENTS

| | | | |
|---|---|---|---|
| 7,611,980 B2* | 11/2009 | Wells et al. | 438/597 |
| 2004/0121536 A1* | 6/2004 | Hung et al. | 438/257 |
| 2007/0160920 A1* | 7/2007 | Adkisson et al. | 430/30 |
| 2008/0085600 A1* | 4/2008 | Furukawa et al. | 438/637 |
| 2009/0186476 A1* | 7/2009 | Yang et al. | 438/618 |

* cited by examiner

*Primary Examiner* — Nadine Norton
*Assistant Examiner* — Mahmoud Dahimene
(74) *Attorney, Agent, or Firm* — Kenyon & Kenyon LLP (57) ABSTRACT

Methods of semiconductor device fabrication techniques using double patterning are disclosed. According to various embodiments of the invention, methods of semiconductor device fabrication using self-aligned double patterning are provided. Particular embodiments of the invention allow creation of logic circuit patterns using two lithographic operations. One embodiment of the invention employs self-aligned double patterning to define two or more sets of parallel line features with a connection feature between the sets. In such embodiments, the sets of parallel line features along with the connection features are formed using two lithographic masks, without the need for an additional mask layer to form the connection. In other embodiments, other features in addition to the connection can be added in the same mask layer.

25 Claims, 8 Drawing Sheets

METHOD OF ELIMINATING A LITHOGRAPHY OPERATION

CROSS REFERENCE TO RELATED APPLICATION

This application is based on and claims priority to U.S. Provisional Patent Application No. 61/024,870, filed on Jan. 30, 2008.

TECHNICAL FIELD

The present invention relates to device manufacturing, and more particularly, some embodiments relate to semiconductor device fabrication techniques using double patterning.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages through which the designer creates an integrated circuit by hierarchically defining functional components of the circuit. From this high-level functional description, a physical circuit implementation dataset is created, which is usually in the form of a netlist. This netlist identifies logic cell instances from a target standard cell library, and describes cell-to-cell connectivity.

A layout file is then created using the netlist. This is accomplished through a layout and routing process, which assigns logic cells to physical locations in the device layout and routes their interconnections. This layout can be transferred or applied to the semiconductor substrate in a series of layers that collectively form the devices that make up the components of the integrated circuit. A process by which such layers are patterned on the substrate is known as photolithography. During photolithography, a series of photomasks created from the layout file are used to transfer the layout onto the substrate layer by layer. A photomask, or mask, provides an image of the physical geometries of its respective integrated circuit layer. Passing light through transparent sections defined by the mask elements transfers the layout pattern for the layer onto the wafer. An imaging lens system projects and focuses the layout onto the substrate at the desired size. The projected light pattern interacts with a photosensitive coating on the wafer and, depending on the coating used, it is cured or rendered susceptible to removal in the areas that were exposed to the light. Accordingly, the projection of the mask pattern onto the coating can be used to transfer the pattern to the wafer.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is limited by the wavelength of the light used, and the ability of the lens system to capture enough diffraction orders from the illuminated mask. The minimum feature size that a projection system can print can be approximated by:

$$F = k1 * \frac{\lambda}{N_A}$$

where F is the minimum feature size, k1 is a coefficient of process-related factors, $\lambda$ is the wavelength of light used and $N_A$ is the numerical aperture of the lens as seen from the wafer. With lithography processes using deep ultraviolet light with wavelengths of 248 to 193 nm, minimum feature sizes of approximately 50 nm can be achieved. Accordingly, the resolution limit of conventional lithography technology is increasingly being challenged by the shrinking dimensions of critical IC feature geometries.

Not only are the critical feature geometries decreasing in accordance with, or even faster than, Moore's Law predictions, the already large number of these feature geometries is growing at a dramatic rate as well. Furthermore, due to process enhancements such as optical proximity correction, the overall polygon count is increasing as well. With lithography technology at wavelengths of 193 nm, optical characteristics of the light are affecting the ability to decrease feature sizes.

Figure 1:
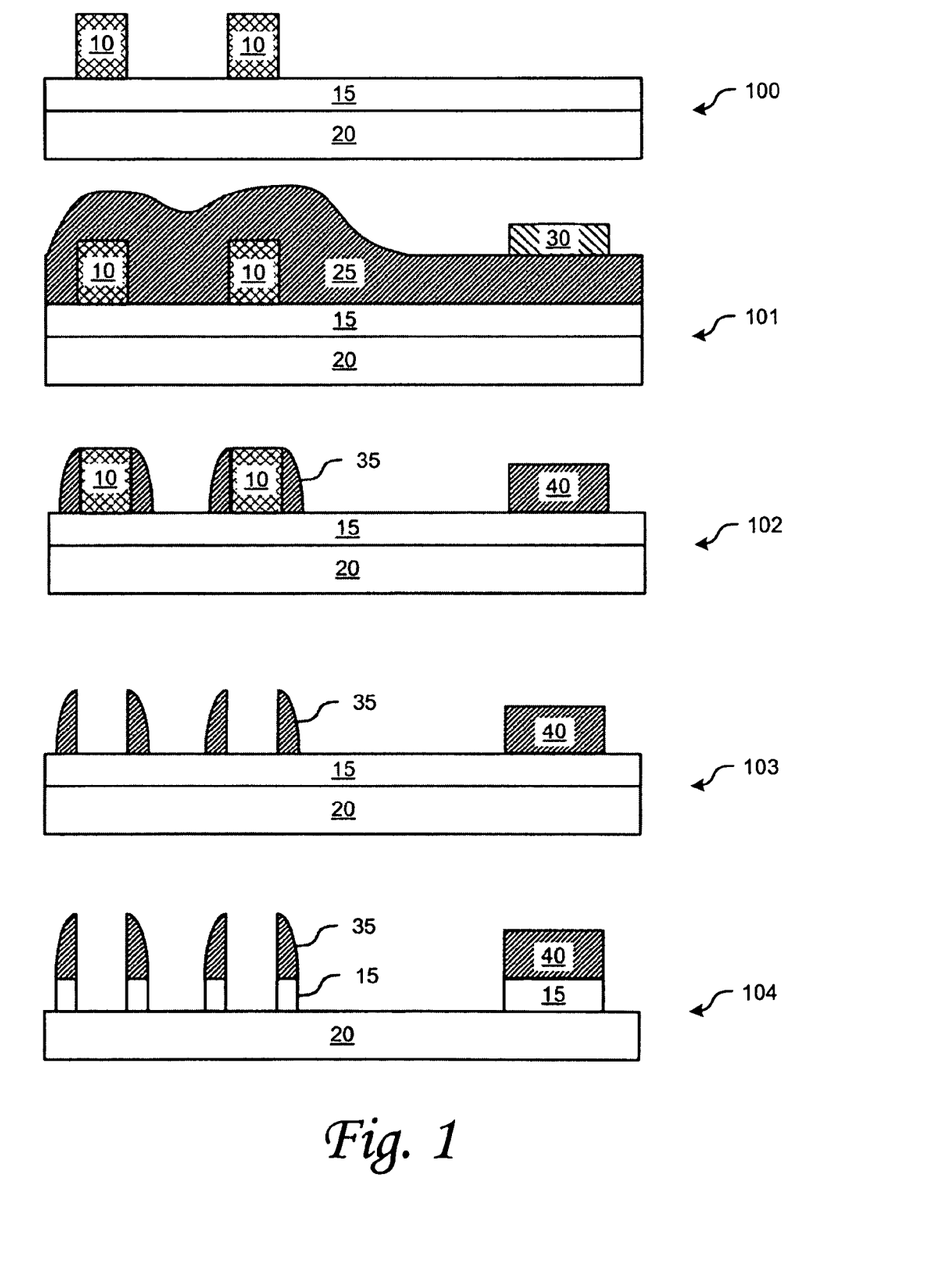
FIG. 1 is a diagram illustrating one example of spacer or self-aligned double patterning.

One class of technologies used to enhance feature density is referred to as double patterning or multiple patterning. There are several types of double patterning in use, the four most common being: double exposure, spacer mask, heterogeneous mask, and intermediate pattern accumulation. FIG. 1 is a diagram illustrating one example of spacer or self-aligned double patterning. Referring now to FIG. 1, in the first part of the process 100, a sacrificial layer 10, which is typically made of poly-silicon, is deposited and then patterned using photolithography. Sacrificial layer 10 is deposited over a substrate comprising one or more hard mask layers 15, which are deposited over the actual layer 20 that is to be patterned.

As illustrated at 101, a spacer material 25 such as, for example, silicon nitride, silicon oxide, or silicon oxynitride is deposited. Also illustrated at 101 is the patterning of a photoresist layer 30 to protect the spacer material in selected locations. Accordingly, another mask layer is used to pattern photoresist 30. As illustrated at 102, spacer material 25 is etched anisotropically, preferentially removing the spacer material on the horizontal surfaces. As a result, the structure illustrated in 103 remains after sacrificial layer 10 is etched away. This structure includes spacer material 35 and 40, which forms a spacer pattern. A subsequent etch process removes the exposed hardmask, transferring the spacer pattern formed by spacer material 35, 40 to underlying layer 20 as illustrated at 104. As an alternative to using photoresist layer 30 to protect spacer material in selected location 40 in order to protect hardmask 15, a photoresist layer could be patterned at 103 to achieve the same result.

Figure 2:
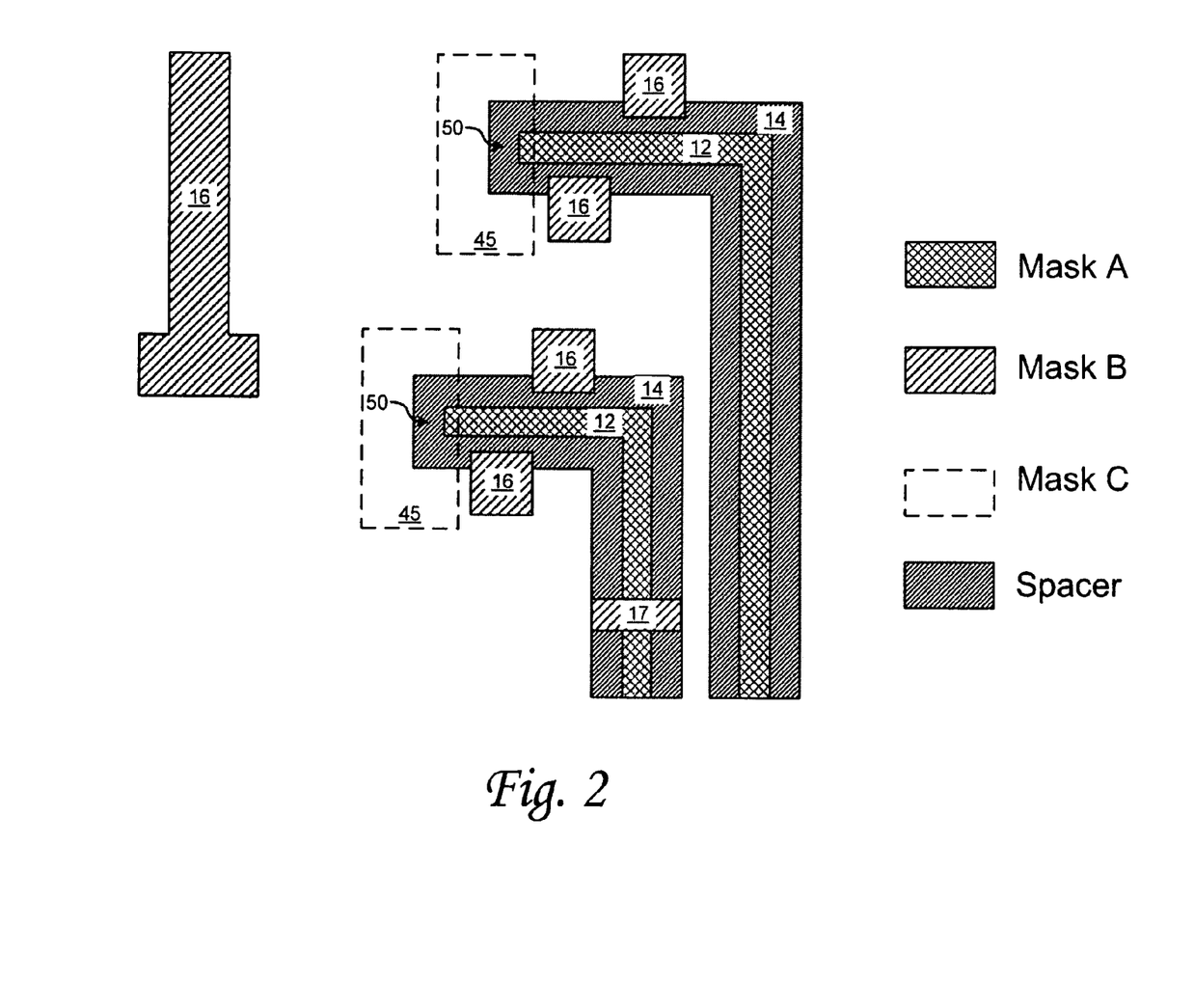
FIG. 2 is a diagram illustrating a top view of a self-aligned double patterning process and masks used to make the illustrated features.

FIG. 2 is a diagram illustrating a top view of an example of patterning created with the example process described in FIG. 1 and masks used to make the illustrated features. Referring now to FIGS. 1 and 2, FIG. 2 shows patterns 12 created by sacrificial layer 10 and Mask A; patterns 14 created by spacer 35 after spacer etch; and components of logic devices 16 created by feature Mask B. With reference to FIG. 1, it is noted that mask B corresponds to patterning of photoresist 30.

As FIG. 2 illustrates, once the polysilicon lines 12 are removed, spacer lines 14 remain and the density is approximately doubled. To remove the short 50 between each pair of spacer lines 14, a third mask layer mask C is used to remove the unwanted parts of spacer as illustrated by dashed lines 45. As the examples provided in FIGS. 1 and 2 illustrate, for each feature line 12 of sacrificial layer 10, the process yields two lines 14, thereby doubling the density.

As these examples also illustrate, conventional techniques using self-aligned double patterning processes are useful for making lines for memory like parallel lines and spaces but utilize at least three masks for making arbitrary patterns. For example, in the instance of logic circuits, conventional techniques do not utilize self-aligned double patterning in forming logic patterns having H-shaped patterns or herring bone patterns. In such examples, according to conventional wisdom, a separate mask layer (mask B) is used to form another pattern 17 to create such shapes for logic circuits.

BRIEF SUMMARY OF EMBODIMENTS OF THE INVENTION

According to various embodiments of the invention, methods of semiconductor device fabrication using self-aligned double patterning are provided. Particular embodiments of the invention allow creation of logic circuit patterns using two lithographic operations. One embodiment of the invention employs self-aligned double patterning to define two or more sets of parallel line features with a connection feature between the sets. In such embodiments, the sets of parallel line features, along with the connection feature, are formed using two lithographic masks, without the need for an additional mask layer to form the connection. In other embodiments, other features in addition to the connection can be added in the same mask layer.

In accordance with an embodiment of the invention, a method for fabricating a semiconductor using self-aligned double patterning is provided. The method includes the process of depositing a layer of a first material on a semiconductor substrate and then patterning the layer to form a first pattern. The first pattern comprises a first line and a second line which defines wide and narrow spaces. The wide space is sufficiently wide such that, given the spacer material used, etch process used and process conditions, spacer material is removed from the horizontal surfaces of the substrate but remains adjacent to vertical surfaces of features. The narrow space is sufficiently wide such that, given the spacer material used, etch process used and process conditions, the spacer material remains within the narrow space to an extent sufficient to cover the underlying substrate. Covering the underlying substrate with spacer material thereby protects the substrate from subsequent operations such as trenching and etching.

Next, the method continues by depositing spacer material over both the substrate and first pattern and, then, subsequently etching the spacer material. The spacer material is etched such that the spacer material is removed from horizontal surfaces of the substrate and the first pattern but remains adjacent to vertical surfaces of the first pattern. The spacer material also remains within a narrow space defined by the first line and the second line. Additionally, in some embodiments, the first material can be removed from the substrate or additional material can be added and the device polished. In one embodiment, the first pattern can comprise sacrificial material, which includes, for example, polysilicon material. The deposition can comprise physical vapor deposition, chemical vapor deposition, electrochemical deposition, molecular beam epitaxy, atomic layer deposition or other deposition techniques.

In another embodiment of the invention, the first line within the first pattern forms a first set of parallel spacer features, while the second line of the first pattern forms a second set of parallel spacer features. The parallel spacer features are typically parallel line features, formed by the spacer material remaining adjacent the vertical surfaces of the first line and second line after a spacer etch process. Further, in some embodiments, the spacer material remaining in the narrow space, defined by the first line and second line, is approximately twice the width of the spacer material remaining adjacent vertical surfaces of the first pattern. In some embodiments, the spacer material remaining in the narrow space forms a connection feature between the first set of parallel spacer features and the second set of parallel spacer features.

In other embodiments, the first line and second line of the first pattern are aligned with respect to each other. In such embodiments, the first set of parallel spacer features, the second set of parallel spacer features, and the connection feature form an H-shape feature pattern. In alternative embodiments, the first line and the second line are staggered with respect to each other, thereby allowing the first set of parallel spacer features, the second set of parallel spacer features, and the connection feature to form a herringbone shape. Typically, logic layouts can be created using features in an H-shape or a herringbone shape.

Some embodiments of the invention employ a method of semiconductor device fabrication using spacer double-patterning using two mask layers. The method includes depositing a pattern of a first material on a semiconductor substrate, wherein the pattern comprises a first line and a second line defined by the first material and a common space between first line and second line; depositing a second material over the substrate; and etching the second material such that the second material is partially removed from the substrate. Upon etching the second material, a pattern of second material is formed such that the pattern comprises a first set of features adjacent the first line, a second set of features adjacent the second line, and a connection between the first set of features and the second set of features remaining in the common space. In additional embodiments, the remaining second material can be further etched in order to trim the pattern of second material.

In other various embodiments, a method for producing datasets for creating a photomask set is provided. These photomasks are utilized in patterning the first pattern according to the invention and, subsequently, trimming material remaining on the substrate according to the invention.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

DETAILED DESCRIPTION OF THE EMBODIMENTS OF THE INVENTION

Various embodiments of the invention provide systems and methods for semiconductor device fabrication using self-aligned double patterning. Embodiments of the invention are directed towards systems and methods using self-aligned double pattern to define two or more sets of parallel spacer features with a connection feature between the sets. In such embodiments, the sets of parallel spacer features along with the connection features are formed using two lithographic masks/steps, without the need for an additional mask layer to form the connection.

In some embodiments of the invention, wide spaces and narrow spaces are utilized to form parallel spacer features and connection features respectively. Examples of spacer features formed using wide spaces include, but are not limited to, line features. Examples of features formed within a narrow space include, but are not limited to, logic components and connection features. As previously noted, the wide space is sufficiently wide such that, given the spacer material used, etch process used and process conditions, spacer material is removed from the horizontal surfaces of the substrate but remains adjacent to vertical surfaces of features. The narrow space, on the other hand, is sufficiently wide such that, given the spacer material used, etch process used and process conditions, the spacer material remains within the narrow space to an extent sufficient to cover the underlying substrate. Covering the underlying substrate with spacer material thereby protects the substrate from subsequent operations such as trenching and etching.

Figure 3:
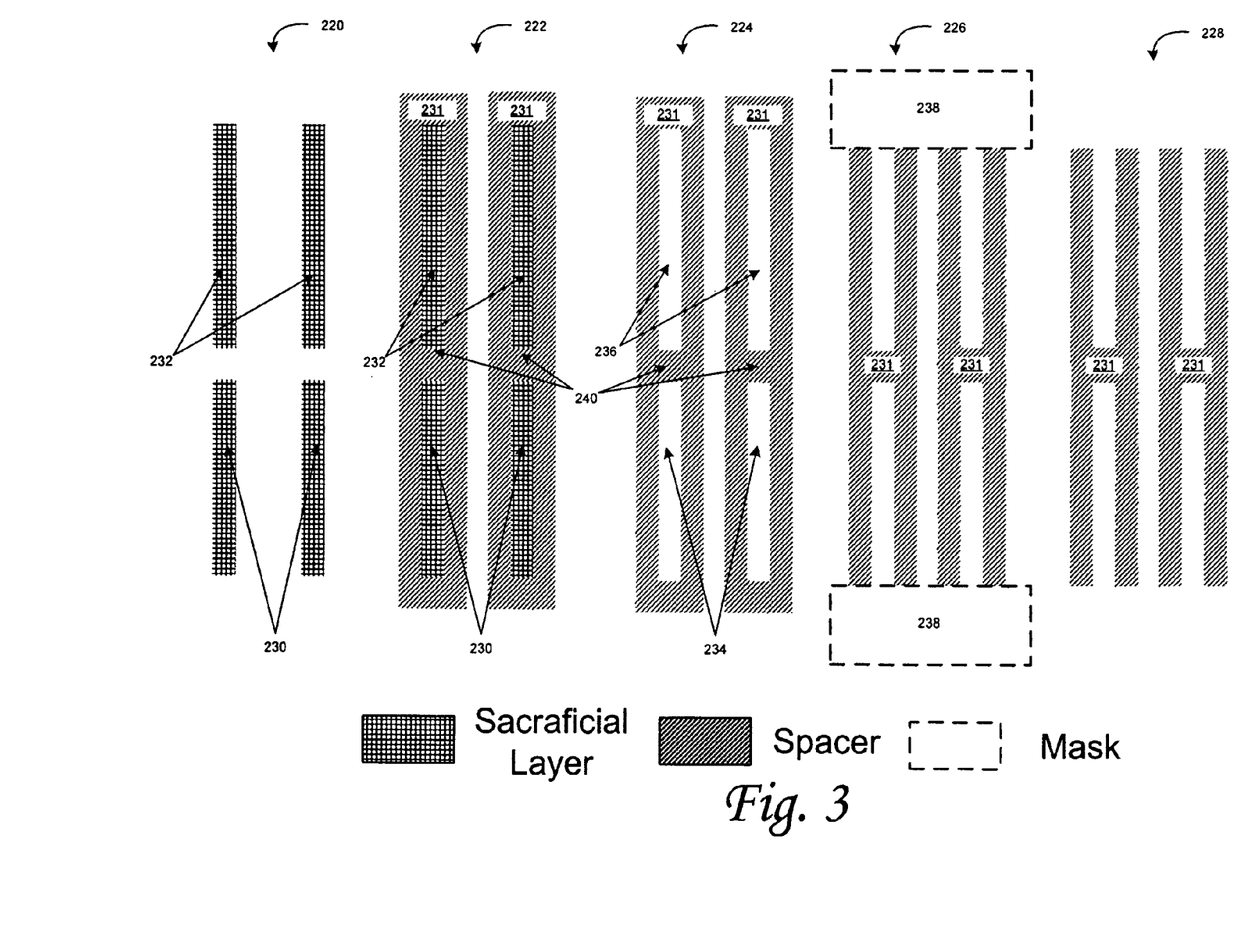
FIG. 3 is a diagram illustrating a top view of example spacer features patterned using self-aligned double patterning in accordance with one embodiment of the invention.

FIG. 3 is a diagram illustrating a top view of example spacer features patterned using self-aligned double patterning to form H-shaped patterns 228 in accordance with one embodiment of the invention. Typically, logic layouts can be created using features in an H-shape or a herringbone shape. The diagram illustrates example patterns that result at different stages of a method in accordance with one embodiment of the invention. However, before describing FIG. 3 in further detail, it would be useful to describe an example method in accordance with one embodiment of this invention.

Figure 4:
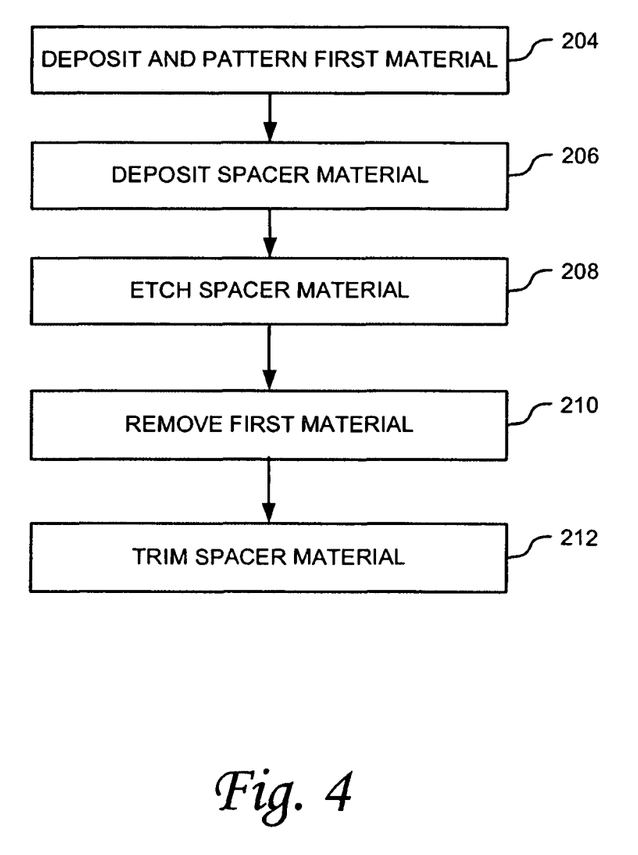
FIG. 4 is an operational flow diagram illustrating an example method for patterning in accordance with one embodiment of the invention.

FIG. 4 is an operational flow diagram illustrating an example method for patterning in accordance with one embodiment of the invention. The method begins at operation 204, where a layer of first material is deposited and patterned. The resulting first pattern defines a first line and a second line, both of which are eventually used to define parallel spacer features and a connection feature between such parallel spacer features. This first pattern can be referred to as the sacrificial layer and can be composed of polysilicon.

At operation 206, spacer material is deposited over the substrate, covering both the substrate and the first pattern (i.e. sacrificial layer) in some embodiments. The spacer material can include materials such as, for example, silicon nitride, silicon oxide or silicon oxynitride. Processes for deposition of this and other layers can include any process that grows, coats, or otherwise transfers or applies a material onto the substrate. For example, deposition can include physical vapor deposition, chemical vapor deposition, electrochemical deposition, molecular beam epitaxy and, atomic layer deposition.

Subsequently, at operation 208, the spacer material previously deposited in operation 206 is etched in such a manner as to preferentially remove spacer material from horizontal surfaces of the substrate and the first pattern while spacer material adjacent to vertical surfaces remains. The spacer material is etched anisotropically to allow preferential removal of the spacer material on horizontal surfaces. Hence, the spacer material that remains comprises spacer material adjacent to vertical surfaces of the first line and second line, which forms spacer features, and spacer material between a space defined by the first line and the second line, which forms a connection feature.

Following the process of etching spacer material (also known as the spacer-etch process), at operation 210, the sacrificial layer that formed the first pattern is removed. Upon removal of the first material at 210, what remains is spacer material retained due to the vertical surfaces of the first line and the second line, which includes the spacer material remaining in the space defined between the first line and second line. Optionally, the method concludes with operation 212, where the remaining spacer material pattern defined by the remaining spacer material is trimmed. In the alternative embodiments, operations 210 and 212 are interchanged.

The operational flow of FIG. 4 shows the formation of the first set of parallel spacer features, the second set of parallel spacer features, and the connection feature in between the two sets, within two lithographic operations. As previously noted, according to one example application of the invention, the spacer material pattern retained forms a first set of parallel spacer features, a second set of parallel spacer features, and a connection feature between the first set and second set. The spacer material remaining in the narrow space defined between the first line and second line forms the connection feature. Unlike the invention, conventional methods require an additional lithographic operation in order to pattern a connection feature.

The operational flow of FIG. 4 is now be described with respect to the example illustrated in FIG. 3. This description illustrates how target pattern 228 of FIG. 3 can be patterned according to the operational flow illustrated in FIG. 4. Pattern 220 illustrates the first pattern formed after depositing and patterning the first material at operation 204. In this particular example, the first pattern comprises sacrificial layer patterns 230 and 232. Sacrificial layer pattern 230 forms the first lines, while sacrificial layer pattern 232 forms the second lines. Pattern 222 illustrates the remaining material after the deposition and etch of the spacer material (at operations 206 and 208 respectively) in accordance with this example. As this example illustrates, the spacer material 231 remains adjacent the vertical surface of sacrificial patterns 230 and 232. Connections 240 are formed as a result of the merger of spacer material remaining within the narrow space defined by sacrificial layer lines 230 and 232. In some embodiments, such a connection is approximately twice the width of the spacer material that remains adjacent the edges of first line 230 and second line 232 that define spacer features. An example of spacer material remaining in a narrow space is further discussed with respect to FIG. 5 and FIG. 6.

Now referring to pattern 224, once the sacrificial layer (comprising lines 230 and 232) has been removed at operation 210, trenches 234 and 236 and spacer material 231 remain. Subsequently, at operation 212, as demonstrated by pattern 226, the remaining spacer material 231 is trimmed using a mask 238. After the trim, the remaining spacer material results in an H-shaped pattern 228.

Figure 5:
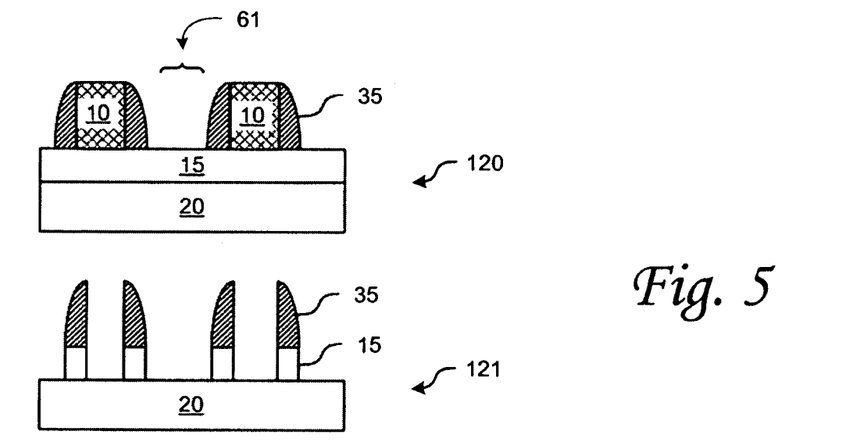
FIG. 5 is a diagram illustrating a cross-sectional view of an example of patterning spacer features in accordance with one embodiment of the invention.

In accordance with one embodiment of the invention, FIG. 5 provides a cross-sectional view of an example of spacer formation using a narrow space. A previously noted, connection features 240 are wider than the spacer material that remains adjacent the vertical surfaces of the first pattern. Connection features 240 can be approximately twice as wide as the spacer material remaining adjacent vertical surfaces of the first pattern.

Figure 6:
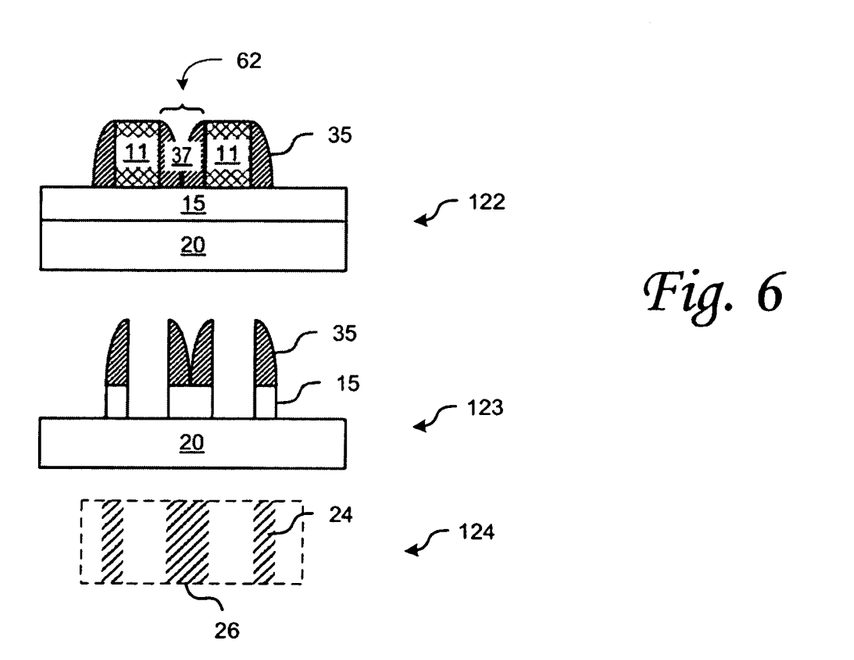
FIG. 6 is a diagram illustrating a cross sectional view of an example of using narrow spaces to create wider feature dimensions in accordance with one embodiment of the invention.

FIG. 6 is a diagram illustrating a cross sectional view of an example of using narrow spaces to create wider feature dimensions in accordance with one embodiment of the invention. Referring now to FIG. 5, illustrated at 120 is a simple example of a wide space 61 after spacer formation. As illustrated at 121, after the polysilicon 10 is removed, a series of spacer lines 35 are remaining. In contrast, at FIG. 6, a narrow space 62 is used to create a feature with a double spacer 37 that is approximately twice the width of the conventional spacer lines 35. Particularly, at 122, traces of sacrificial layer 11 are placed closer to one another such that when spacer material is removed from the layer, some spacer material 37 remains in the space 62 formed between the two sacrificial traces 11. Accordingly, after the sacrificial layer is removed and the pattern transferred to substrate 20, a pattern such as that illustrated at 123 remains.

As shown in the partial top-view projection 124 for this example, the resultant structure includes two lines 24 and a logic device component 26, wherein logic device component 26 is approximately twice the width of lines 24. Logic device component 26 might be used, for example, for contact pads or peripheral circuitry and so on. This 2:1 ratio, or approximate 2:1 ratio, can be useful for certain devices such as, for example, memory, which tends to follow this aspect ratio, or connections between parallel features, such as connection 240. The actual width of logic device components relative to lines depends on factors such as the properties of the spacer material, its adherence to vertical surfaces of the sacrificial layer features, characteristics of the etch process and so on. Generally, a narrower-width space results in a narrower feature and a wider space in a wider feature. However, too wide of a space may result in a loss of spacer material 37 in portions of the space, depending on materials used, the thickness of the spacer material applied and the etch process. Accordingly, alternative aspect ratios of other than 2:1 can be achieved by varying these factors.

Figure 7A:
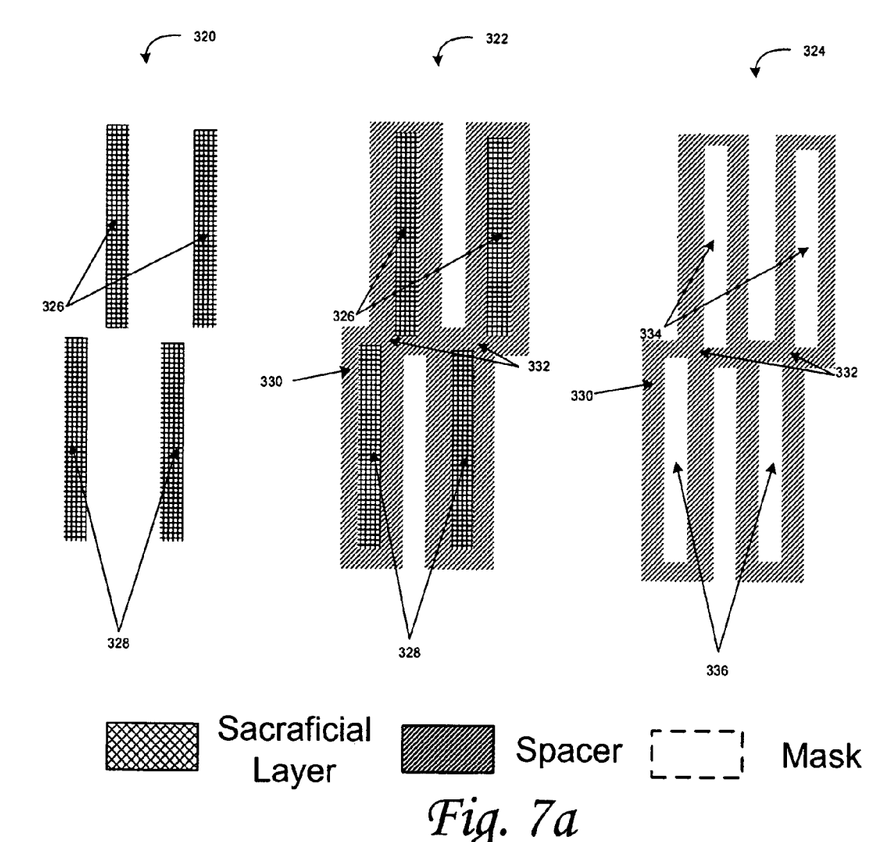
FIGS. 7a and 7b are diagrams illustrating top views of example spacer features patterned using self-aligned double patterning in accordance with one embodiment of the invention.
Figure 7B:
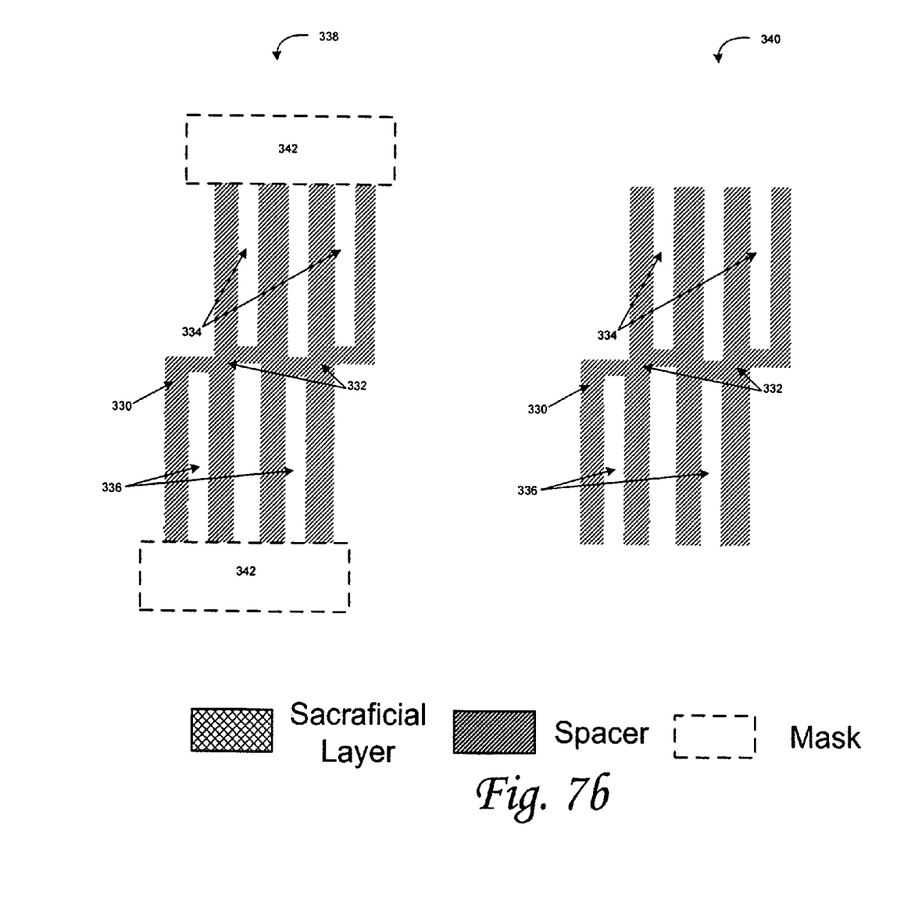

FIGS. 7a and 7b are diagrams illustrating top views of an example of spacer features patterned to form a herringbone shape using self-aligned double patterning in accordance with one embodiment of the invention. As previously noted, typically, logic layouts can be created using features in an H-shape or a herringbone shape. Pattern 320 illustrates the first pattern according to an embodiment of the invention, comprising sacrificial layer patterns 328 and 326. Similar to FIG. 3, the first pattern is used to form spacer material pattern 322. Connections 320 are formed by the narrow space defined by sacrificial layer pattern 328 and sacrificial layer pattern 326. Pattern 328 comprises the first line of the first pattern, while pattern 326 comprises second line of the first pattern. Upon removal of the sacrificial layer (operation 210), trenches 334 and 336 remain, as illustrated in pattern 324. Now referring to FIG. 7b, pattern 338 illustrates how mask 342 is utilized to trim the remaining spacer material to form the herringbone spacer material pattern 340.

In some embodiments, methods are provided for producing datasets used to create photomasks that are utilized in accordance with the invention. Within such embodiments, the method begins by receiving a layout dataset, wherein the layout dataset represents the features of a circuit (also known as a circuit design). Based upon this layout dataset, a first dataset containing representations of the lines and connection features within the layout of the circuit design is derived. Subsequently, this first dataset is used to generate the first mask dataset. The first mask dataset represents a first pattern in accordance with the invention. The first pattern comprises a first line and second line which define wide and narrow spaces. These wide and narrow spaces are defined such that during a spacer-etch process, the wide spaces form or define the parallel line features and the narrow spaces form or define connection features. With respect to the wide spaces, the parallel line features are formed when spacer material remains adjacent vertical surfaces after the spacer-etch process. In regards to the narrow spaces, the connection features are formed when spacer material remains within the narrow spaces after the spacer-etch process. Additionally, in some embodiments, the dataset for the trim mask, which can be used to remove undesired spacer material, can also be derived based on the circuit design.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed or deposited thereon.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 8:
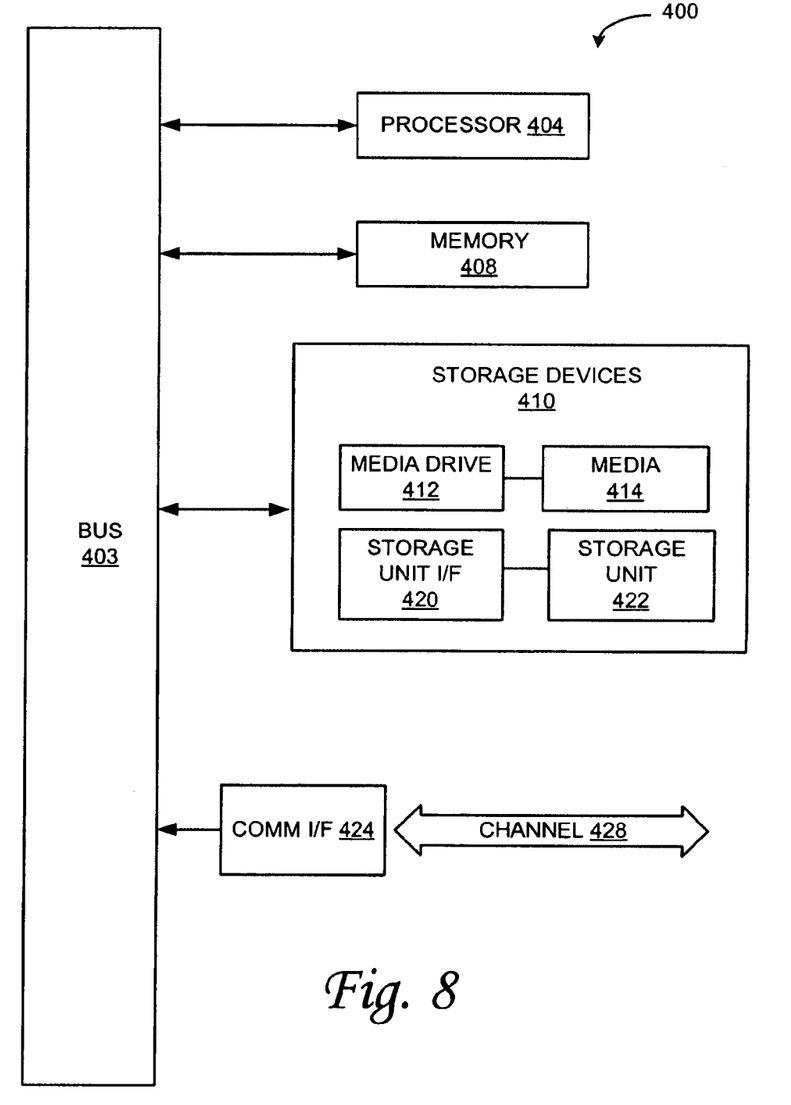
FIG. 8 is a simplified block diagram illustrating an example-computing module in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 8. Various embodiments are described in terms of this example-computing module 400. After reading this description, it will become apparent to a person skilled in the relevant art how to implement the invention using other computing modules or architectures.

Referring now to FIG. 8, computing module 400 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 400 might also represent computing capabilities embedded within or otherwise available to a given device. For example, a computing module might be found in other electronic devices. Computing module 400 might include, for example, one or more processors or processing devices, such as a processor 404. Processor 404 might be implemented using a general-purpose or special-purpose processing engine such as, for example, a microprocessor, controller, or other control logic.

Computing module 400 might also include one or more memory modules, referred to as main memory 408. For example, random access memory (RAM) or other dynamic memory might be used for storing information and instructions to be executed by processor 404. Main memory 408 might also be used for storing temporary variables or other intermediate information during execution of instructions by processor 404. Computing module 400 might likewise include a read only memory ("ROM") or other static storage device coupled to bus 402 for storing static information and instructions for processor 404.

The computing module 400 might also include one or more various forms of information storage mechanism 410, which might include, for example, a media drive 412 and a storage unit interface 420. The media drive 412 might include a drive or other mechanism to support fixed or removable storage media 414. For example, a hard disk drive, a floppy disk drive, a magnetic tape drive, an optical disk drive, a CD or DVD drive (R or RW), or other removable or fixed media drive. Accordingly, storage media 414 might include, for example, a hard disk, a floppy disk, magnetic tape, cartridge, optical disk, a CD or DVD, or other fixed or removable medium that is read by, written to or accessed by media drive 412. As these examples illustrate, the storage media 414 can include a computer usable storage medium having stored therein particular computer software or data.

In alternative embodiments, information storage mechanism 410 might include other similar instrumentalities for allowing computer programs or other instructions or data to be loaded into computing module 400. Such instrumentalities might include, for example, a fixed or removable storage unit 422 and an interface 420. Examples of such storage units 422 and interfaces 420 can include a program cartridge and cartridge interface, a removable memory (for example, a flash memory or other removable memory module) and memory slot, a PCMCIA slot and card, and other fixed or removable storage units 422 and interfaces 420 that allow software and data to be transferred from the storage unit 422 to computing module 400.

Computing module 400 might also include a communications interface 424. Communications interface 424 might be used to allow software and data to be transferred between computing module 400 and external devices. Examples of communications interface 424 might include a modem or softmodem, a network interface (such as an Ethernet, network interface card, WiMAX, 802.XX or other interface), a communications port (such as for example, a USB port, IR port, RS232 port, Bluetooth interface, or other port), or other communications interface. Software and data transferred via communications interface 424 might typically be carried on signals, which can be electronic, electromagnetic, optical or other signals capable of being exchanged by a given communications interface 424. These signals might be provided to communications interface 424 via a channel 428. This channel 428 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to storage media such as, for example, memory 408, storage unit 420, and media 414. These and other various forms of computer program media or computer usable media may be involved in providing one or more sequences of one or more instructions to a processing device for execution. When executed, such instructions might enable the computing module 400 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What we claim is:

1. A method of semiconductor device fabrication, comprising:
    depositing a first layer of a first material and patterning the layer to form a first pattern on a substrate, wherein the first pattern comprises a first set of lines and a second set of lines, the first set of lines and the second set of lines defining wide and narrow spaces;
    depositing spacer material over the first pattern on the substrate; and
    etching the spacer material such that the spacer material is removed from horizontal surfaces of the substrate and the first pattern but remains adjacent to vertical surfaces of the first pattern;
    wherein the spacer material adjacent to each of the vertical surfaces defining one of the narrow spaces is connected such that an upper surface of the substrate is completely covered by spacer material in that narrow space.

2. The method of claim 1, further comprising removing the first pattern from the substrate.

3. The method of claim 1, further comprising depositing a second layer of the first material over the substrate after the spacer material is etched and polishing the surface.

4. The method of claim 1, wherein the first set of lines defines a first set of parallel spacer features and the second set of lines defines a second set of parallel spacer features.

5. The method of claim 4, wherein the spacer material in the one of the narrow spaces is approximately twice the width of the spacer material remaining adjacent to vertical surfaces in one of the wide spaces of the first pattern.

6. The method of claim 5, wherein the spacer material in the one of the narrow spaces forms a connection feature between the first set of parallel spacer features and the second set of parallel spacer features.

7. The method of claim 6, wherein the first set of lines and the second set of lines are aligned with respect to each other.

8. The method of claim 7, wherein the first set of parallel spacer features, the second set of parallel spacer features, and the connection feature form an H-shape feature pattern.

9. The method of claim 6, wherein the first set of lines and the second set of lines are staggered with respect to each other.

10. The method of claim 9, wherein the first set of parallel spacer features, the second set of parallel spacer features, and the connection feature form a herringbone shape.

11. The method of claim 1, wherein the first material comprises polysilicon.

12. The method of claim 1, wherein depositing comprises physical vapor deposition, chemical vapor deposition, electrochemical deposition, molecular beam epitaxy or atomic layer deposition.

13. The method of claim 1, wherein the spacer material comprises silicon nitride, silicon oxide, or silicon oxynitride.

14. A method of semiconductor device fabrication using spacer double-patterning using two mask layers, comprising:
    depositing a layer of a first material and patterning the layer to form a pattern on a semiconductor substrate, wherein the pattern comprises a first set of lines and a second set of lines defined by the first material and a common space between the first set of lines and the second set of lines;
    depositing a second material over the substrate; and
    etching the second material such that the second material is partially removed from the substrate, thereby forming a pattern of second material, the pattern of second material comprising a first set of features adjacent the first set of lines, a second set of features adjacent the second set of lines, and a connection feature between the first set of features and the second set of features in the common space, the connection feature connecting the first set of features and the second set of features with the second material.

15. The method of claim 14, wherein the connection feature in the common space is approximately twice the width of the second material adjacent the first set of lines or the second set of lines.

16. The method of claim 14, wherein the first material comprises polysilicon.

17. The method of claim 14, wherein depositing comprises physical vapor deposition, chemical vapor deposition, electrochemical deposition, molecular beam epitaxy or atomic layer deposition.

18. The method of claim 14, wherein the second material comprises silicon nitride, silicon oxide, or silicon oxynitride.

19. The method of claim 14, further comprising etching the second material in order to trim the pattern of second material.

20. A method of producing a dataset for creating a photomask set for a layout of a circuit design, comprising:
    receiving a layout dataset representing features of the circuit;
    deriving a first dataset representing lines and connection features within the layout dataset;
    generating a first mask dataset from the first dataset, wherein the first mask dataset represents a first pattern comprising a first set of lines and a second set of lines, wherein the first set of lines and the second set of lines define wide and narrow spaces and wherein during a spacer-etch process, the wide spaces define parallel line features such that spacer material remains adjacent to vertical surfaces and the narrow spaces define connection features such that spacer material remains within the narrow spaces, wherein the spacer material adjacent to each of the vertical surfaces of one of the narrow spaces is connected such that that narrow space is completely covered by spacer material; and
    generating a second mask dataset, wherein the second mask dataset represents a second pattern comprising portions of the spacer material to be further etched in order to trim the first pattern.

21. The method of claim 20, wherein the first set of lines defines a first set of parallel line features and the second set of lines defines a second set of parallel line features.

22. The method of claim 21, wherein the first set of lines and the second set of lines are aligned with respect to each other.

23. The method of claim 22, wherein the first set of parallel line features, the second set of parallel line features, and the connection feature form an H-shape feature pattern.

24. The method of claim 21, wherein the first set of lines and the second set of lines are staggered with respect to each other.

25. The method of claim 24, wherein the first set of parallel spacer features, the second set of parallel spacer features, and the connection feature form a herringbone shape.

* * * * *